(12) United States Patent
Kim et al.

(10) Patent No.: US 6,518,642 B2
(45) Date of Patent: Feb. 11, 2003

(54) INTEGRATED CIRCUIT HAVING A PASSIVE DEVICE INTEGRALLY FORMED THEREIN

(75) Inventors: Hong-Soo Kim, Seoul (KR); Joon-Hee Lee, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/878,118

(22) Filed: Jun. 6, 2001

(65) Prior Publication Data

US 2002/0185738 A1 Dec. 12, 2002

(51) Int. Cl.[7] ............................................... H01L 29/00
(52) U.S. Cl. ..................... 257/528; 257/532; 257/533; 438/329
(58) Field of Search ..................... 257/202–211, 909, 257/50, 209, 528, 529–535; 438/128, 129, 329, 957

(56) References Cited

U.S. PATENT DOCUMENTS 5,773,857 A * 6/1998 Ura ........................... 257/111

FOREIGN PATENT DOCUMENTS

JP          08-181290      * 12/1996

OTHER PUBLICATIONS

Takuuchi, et al. A Self–Aligned STI Process Integration for Low Cost and Highly Reliable 1 Gbit Flash Memories 1998, pp. 102, 103.

Arbuckle, et al. Processing Technology for Integrated Passive Devices, Solid State Technology, Nov. 2000, pp. 84 and 85.

* cited by examiner

Primary Examiner—David Nelms
Assistant Examiner—Long Tran
(74) Attorney, Agent, or Firm—Marger Johnson & McCollom, P.C.

(57) ABSTRACT

The invented method and device provide a reliable contact to a passive device of a semiconductor circuit device, the passive device being, for example, a resistor, an inductor, a fuse or the like. Adjacent, spaced, elevated, so-called dummy pattern (shoulder) regions are formed under the portions of the passive device on which the contact hole is formed. The shoulder region is formed of the same material as the first conductive layer of the gate of the peripheral transistor. The electrode may be formed through the contact hole to be a reliable contact to the integrated passive device.

36 Claims, 11 Drawing Sheets

INTEGRATED CIRCUIT HAVING A PASSIVE DEVICE INTEGRALLY FORMED THEREIN

FIELD OF THE INVENTION

The present invention relates to an integrated circuit device having a passive device, and more particularly to an integrated circuit (IC) having a passive device integrally formed therein.

BACKGROUND OF THE INVENTION

Generally a nonvolatile memory device comprises a memory cell transistor having a stacked gate, a source and a drain, and a peripheral circuit transistor having a single-layer gate, a source and a drain for driving the memory cell transistor in a peripheral circuit region. The stacked gate of the memory cell transistor comprise a floating gate storing a data, a control gate controlling the floating gate, and an interdielectric layer formed therebetween. The single-layer gate is formed of a single-level conductive layer. But in recent years, the peripheral circuit transistor in a peripheral circuit region also has a stacked gate structure as well as the memory cell transistor. Such is disclosed by Y. Takeuchi, et al in Symposium on VLSI technology Digest of Technical Papers, 1998, pp. 102, 103, entitled: "A Self-Aligned STI Process Integration for Low Cost and Highly Reliable 1 Gbit Flash Memories."

In accordance with this prior art teaching, a first portion of the peripheral circuit transistor gate and a floating gate of the memory cell transistor are formed of a first conductive layer and a second portion of the peripheral circuit transistor gate and the control gate of the memory cell transistor are formed of a second conductive layer. The first portion and the second portion of the peripheral circuit transistor gate are connected with each other through a butting contact. The nonvolatile memory device uses a passive device, e.g., a fuse for repairing a defective memory cell. The fuse is formed of only the second conductive layer, without affecting the first conductive layer thereunder, to prevent the second conductive layer from shorting with the first conductive layer after the fuse is cut, e.g. laser-blown, (opened).

Passive devices including resistors, inductors and capacitors have been integrated recently into semiconductor-based ICs, such as are described by Arbuckle, et al. in *Processing technology for integrated passive devices*, Solid State Technology, November 2000, familiarity with which is assumed.

A layout (plan) view in FIG. 1 and cross-sectional views in FIGS. 2–5 illustrate the nonvolatile memory device including a fuse formed of a second conductive layer, and a method relating thereto.

FIG. 1 is a layout view illustrating the passive device region 10 including a fuse 11, a peripheral circuit transistor (peri-transistor) region 12 having a peripheral transistor 18, and a memory cell array region 14 including one or more memory cells 16. FIG. 1 also shows plural metal contacts 5a, 5b, and 5c used for electrical interconnetion. The peri-transistor region 12 may be seen to include a peripheral circuit transistor 18 having a gate formed of a second conductive layer 22a and a first conductive layer 20a, and cell array region 14 may be seen to include the one or more memory cell 16 having a control gate 22b and floating gate 20b.

FIGS. 2 through 5 are cross-sectional views of the related art structure taken generally along the line X–X' of FIG. 1.

As shown in FIG. 2, the first conductive layer is formed of a first polysilicon layer 24, which may be seen to overlie a field oxide layer 26, which in turn will be understood to overlie a substrate 1.

As shown in FIG. 3, an interlayer insulating layer 28 typically is formed of a first oxide film/silicon nitride film/second oxide film (ONO) to overlie the field oxide layer 26. A second conductive layer is formed as a stacked layer of a second polysilicon layer 30a and a tungsten silicide layer 30b on the interlayer insulating layer 28. Finally, a mask oxide layer 32 is formed to overlie the second conductive layer. The memory cell gate 20b, 22b and the peripheral circuit transistor gate 20a, 22a are formed by patterning the mask oxide layer 32 and the second conductive layer and first conductive layer. Source/drain regions 70, 80 of the memory cell transistor 16 are formed adjacent the memory cell gate 20b, 22b. Source/drain regions (not shown) of peripheral circuit transistor 18 are formed on the substrate 1.

A butting contact typically is formed next as part of a patterning step shown in FIG. 4. The butting contact will be understood to provide for directly applying a voltage to a first conductive layer (first portion) 20a of the peripheral circuit transistor gate 20a, 22a.

FIG. 4 illustrates a first step of formation of the butting contact area 34 in the peri-transistor region 12 of the memory device whereby a predetermined portion of the mask oxide layer 32, the tungsten silicide layer 30b and the polysilicon layer 30a are selectively removed.

At the same time, i.e. during formation of the butting contact of peri-transistor region 12, the fuse 11 of passive device region 10 is formed by patterning the second conductive layer.

In FIG. 5, it may be seen that a first silicon nitride layer 36, a first interlayer dielectric (ILD1) layer 38, a second silicon nitride layer 40 (which acts as an etching stopper layer) and a second interlayer dielectric (ILD2) layer 42, are sequentially formed over the passive device region 10, peri-transistor region 12 and cell array region 14 of the memory device. One or more contact holes, for providing electrical connection to the gate and the fuse, are formed by etching the first and second ILD1, ILD2 layers 38, 42, the first and second silicon nitride layers 36, 40 and, at least in part, the mask oxide layer 32.

Unfortunately, during etching of the ILD1 layer 38, 42 and the silicon nitride layers 36, 40 to form a contact hole, the surface of the fuse 11 may not entirely open. This is because of the step difference between the fuse 11 and the gates 22a, 22b, which two features may be seen to lie in two parallel planes at different elevations above the substrate. This step difference is most clearly seen near the middle of the structure shown in FIG. 3. The surface of the tungsten silicide layer of the gate 22a that is at an elevation higher than that of the fuse 11 is opened prior to exposing the surface of the tungsten silicide layer that forms the fuse 11. As a result, the contact hole 5a for the fuse 11 is not completely opened.

Thus, the electrode or conductive path 55a formed in the metal contact hole 5a may fail to connect to the fuse 11, as illustrated in passive device region 10 of FIG. 5. The reliability of the memory device is thus degraded, as will be described in further detail below.

FIG. 5 illustrates the final related art steps of forming other conductive paths 55b and 55c. The steps may be seen to include depositing the first silicon nitride layer 36, the ILD1 layer 38, the second nitride stopping layer 40 and the second ILD layer 42 over the entire surface of the memory device including the passive device region 10, the peri-transistor region 12 and the cell array region 14 and then filling patterned contact holes 5b, 5c etched therethrough with conductive material to form plural conductive paths 55b, 55c.

It may be seen from FIG. 5 that the conductive paths 55a, in the passive device region 10 in which fuse 11 is formed, do not reach the tungsten silicide layer 30b. This is because an intervening thin oxide layer remains—between the conductive paths 55a and the tungsten silicide layer 30b—that covers, and thus fails to fully expose, the tungsten silicide layer 30b, at an area indicated by C in FIG. 5 due to the step difference between the fuse 11 and the gate 22a as discussed above.

Accordingly, in accordance with related art processes and structures, electrical contact is inhibited and often prevented. This is the source of the reliability problems mentioned above in memory and other semiconductor devices.

SUMMARY OF THE INVENTION

The present invention provides a reliable contact to a passive device region of an integrated circuit device, the passive device being, for example, a resistor, an inductor, or a fuse for disabling selected circuit portions, e.g. by laser-blowing or the like. Adjacent, spaced, elevated, so-called dummy pattern (shoulder) regions are formed under the portions of the passive device on which the contact hole is formed. The shoulder region is formed of the same material as the first conductive layer of the gate of the peripheral transistor. Contact holes may be formed that extend reliably through interlayer dielectric layers over the passive device, to the integrated passive device. Therefore, the electrodes may be formed through the contact holes to be a reliable contact to the integrated passive device.

DETAILED DESCRIPTION OF THE PREFERRED EMBODIMENT

The invented nonvolatile memory device is divided into a memory cell region having a plurality of memory cells, a peripheral circuit region having a peripheral circuit transistor region and a passive device region. The peripheral circuit transistor region comprises a peripheral circuit transistor for driving the memory cells. The transistor includes a stacked gate structure. The passive device region includes a resistor, an inductor or a fuse, of unique structure and formation.

Figure 1:
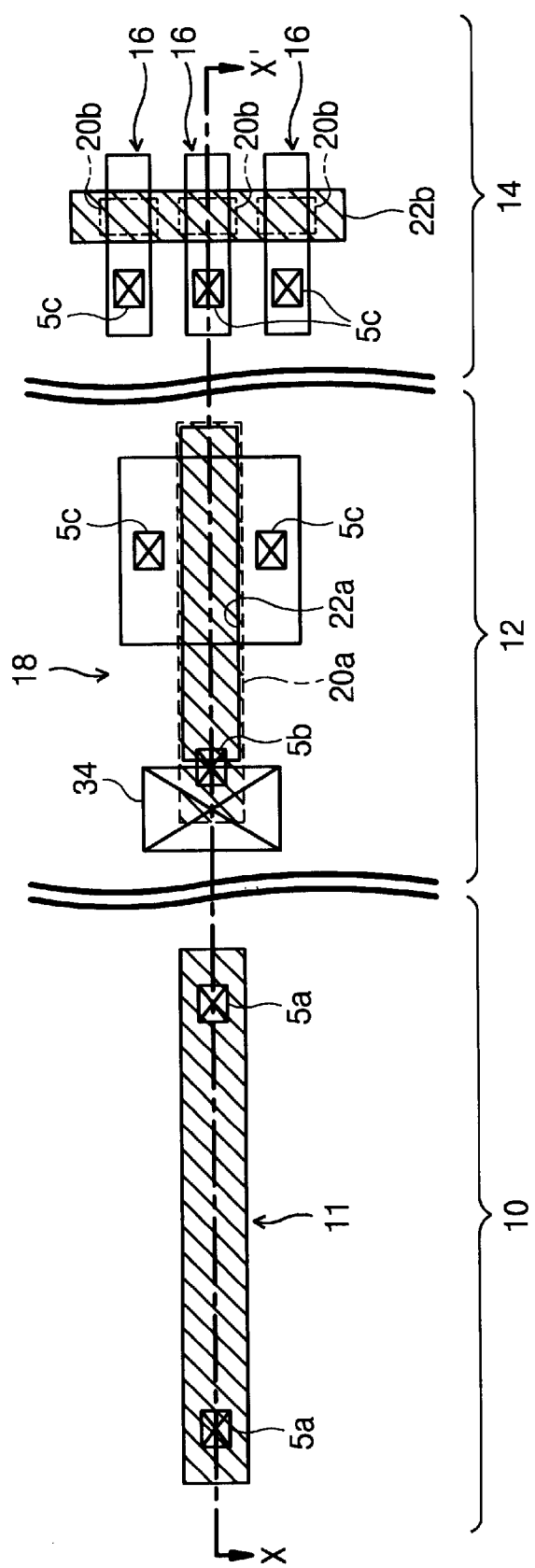
FIG. 1 is a top plan view of a related art nonvolatile memory device.
Figure 2:
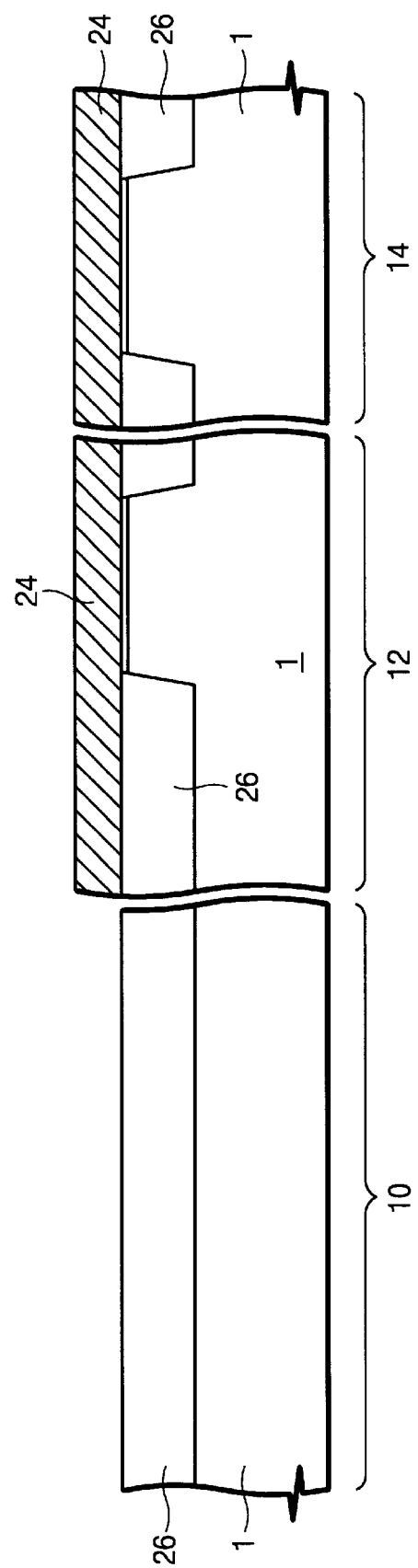
FIGS. 2–5 are cross-sectional views of the related art device structure of FIG. 1, taken generally along the lines X–X' of FIG. 1, and illustrate sequential process steps of the device manufacturing.
Figure 3:
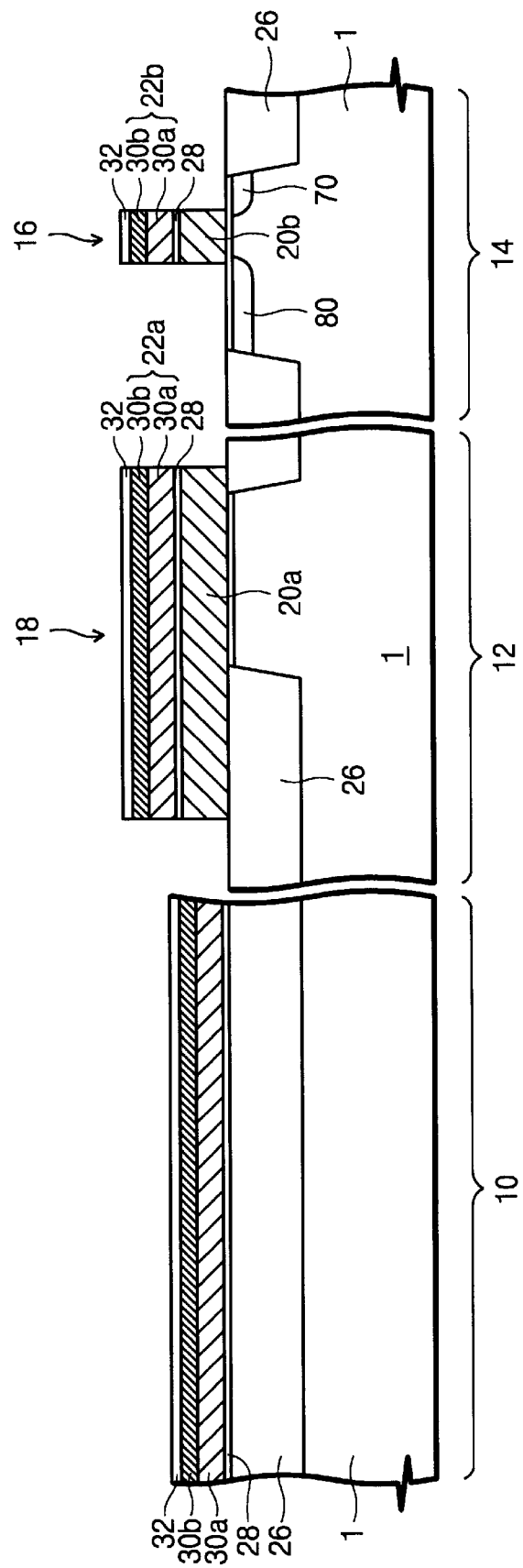
Figure 6:
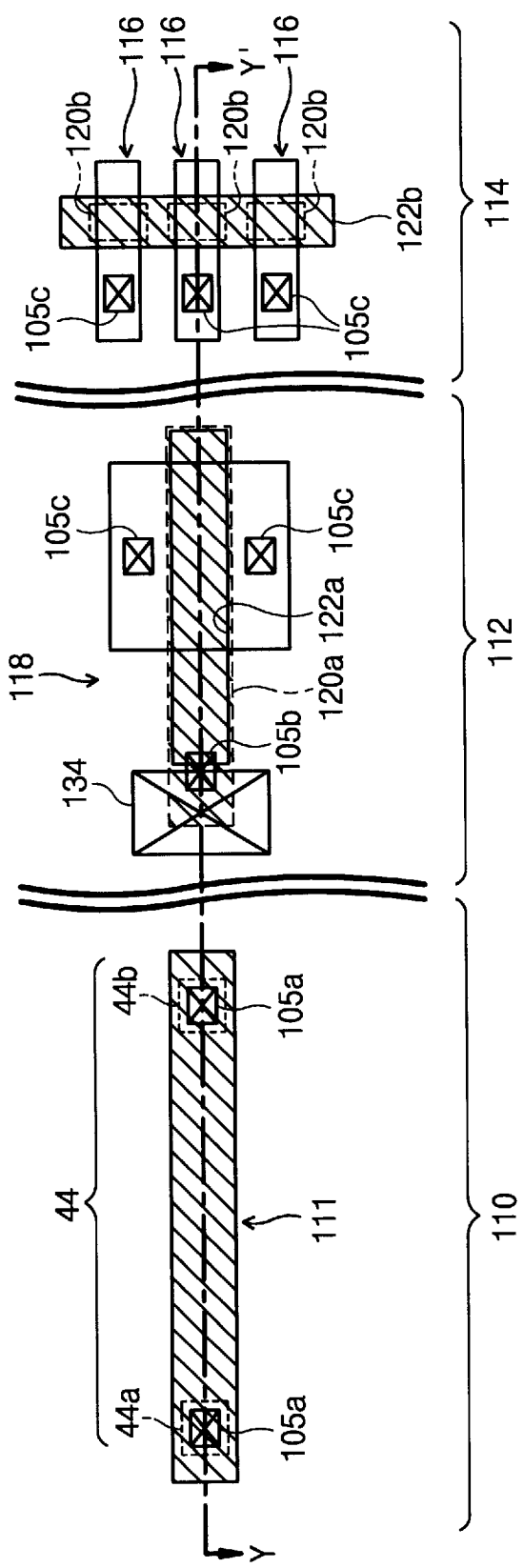
FIG. 6 is a top plan view of a non-volatile memory device having a passive device region in accordance with one embodiment of the invention.

FIG. 6 is a top plan view illustrating the layout of the nonvolatile memory device according to the present invention, wherein line Y–Y' is a section line for illustrating a passive device, for example, the fuse 111, as well as the peripheral circuit transistor and the memory cell structure 118. FIG. 6 may be seen to be very similar to FIG. 1, but the fuse 111 is slightly wider because it accommodates a unique feature of the invention in accordance with a preferred embodiment thereof. Two rectangular, dummy patterns or raised shoulder regions 44 are formed under the metal contact 105a for the fuse 111. The elevation of these regions by forming the raised shoulder regions 44 under the metal contact 105a will be seen to provide an important advantage over the related art.

Figure 10:
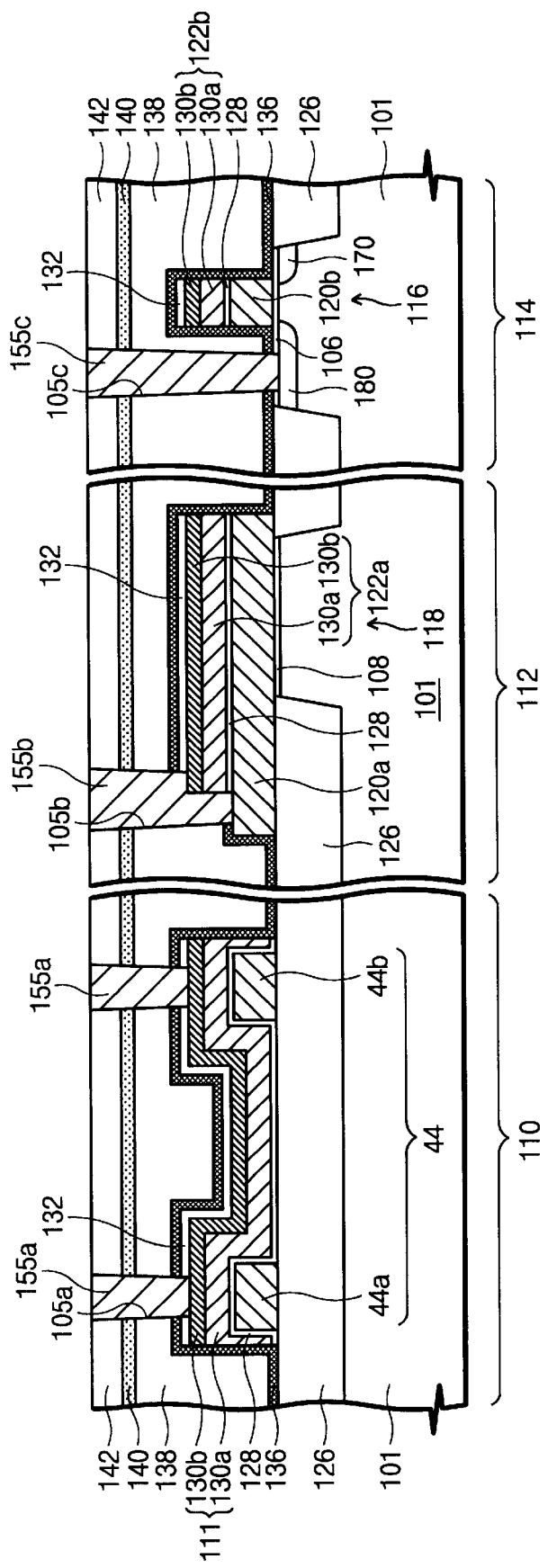

FIG. 10 is a cross sectional view of a nonvolatile memory device structure according to the present invention, taken along the line Y–Y' of FIG. 6.

A field oxide layer 126 is formed on a semiconductor substrate 101 to define an active region and an isolation region. The field oxide layer 126 is formed in an upper surface of a substrate 101 by a shallow trench filled with a dielectric material or by LOCOS-type isolation.

Each of one or more memory cells 116 in a cell array region 114 includes a source 170 and a drain 180 formed in the substrate 101 and a floating gate 120b (a first polysilicon layer). An interlayer insulating (ONO) layer 128, a control gate 122b (a second polysilicon layer 130a and a tungsten silicide layer 130b, a mask oxide layer 132, a first silicon nitride layer 136, a first interlayer dielectric (ILD1) layer 138, a second silicon nitride layer 140 used as a stopper layer and a second interlayer dielectric layer (ILD2) 142 are formed, as illustrated. Finally, a bit line electrode 155c is connected to the drain 180, as illustrated.

In the peri-transistor region 112, a peripheral circuit transistor 118 includes source/drain regions 170, 180 in the substrate 101 and a gate electrode provided with the first conductive layer (first portion) 120a, the interlayer insulating (ONO) layer 128 being formed on the first conductive layer 120a, and the second conductive layer 122a being formed on the interlayer insulating (ONO) layer 128. The gate electrode extends along the field oxide layer 126 to form a butting conductive path 155b connecting the second conductive layer 122a and the first conductive layer 120a as shown. A part of the second conductive layer 122a is exposed by a butting contact pattern for easily forming the contact between the first conductive layer 120a and the second conductive layer 122a by the conductive path 155b via a contact hole 105b.

In the passive device region 110, a first and second laterally spaced dummy patterns or shoulder regions 44 (44a, 44b) of the first conductive layer are formed over the field oxide layer 126. Each of the dummy patterns 44 may be formed of a plurality of small dummy patterns. The dummy patterns 44 have a thickness that defines a vertical extent of the dummy patterns 44 on the field oxide layer 126. The dummy patterns 44a, 44b define therebetween a lower-elevation lateral extent of an exposed region of the field oxide layer 126. The fuse 111 is formed of the second conductive layer (a second polysilicon layer 130a and a tungsten silicide layer 130b), overlying the dummy patterns 44 and lateral extent of the exposed region of the field oxide layer 126. The fuse 111 comprises a first portion overlying the lateral extent of the exposed of the field oxide layer 126 and a second portion overlaying the first dummy pattern 44a and a third portion overlying the second dummy pattern 44b. The fuse 111 is insulated from the dummy patterns 44 by the interlayer insulating layer (ONO) 128. The mask oxide layer 132 as a protective layer is formed over the second conductive layer. Contact holes 105a for conductive paths 155a are formed over the dummy patterns 44, through the ILD2 layer 142, the second silicon nitride layer 140, the ILD1 layer 138, the first silicon nitride layer 136, and the mask oxide layer 132.

Therefore, the conductive paths 155a formed through the contact holes 105a are substantially aligned with the dummy patterns 44. The dummy patterns 44 under the electrodes 155a of the fuse 111 are formed such that the fuse 111 and the second conductive layer 122a of the gate of the peripheral circuit transistor 118 are substantially coplanar.

Figure 7:
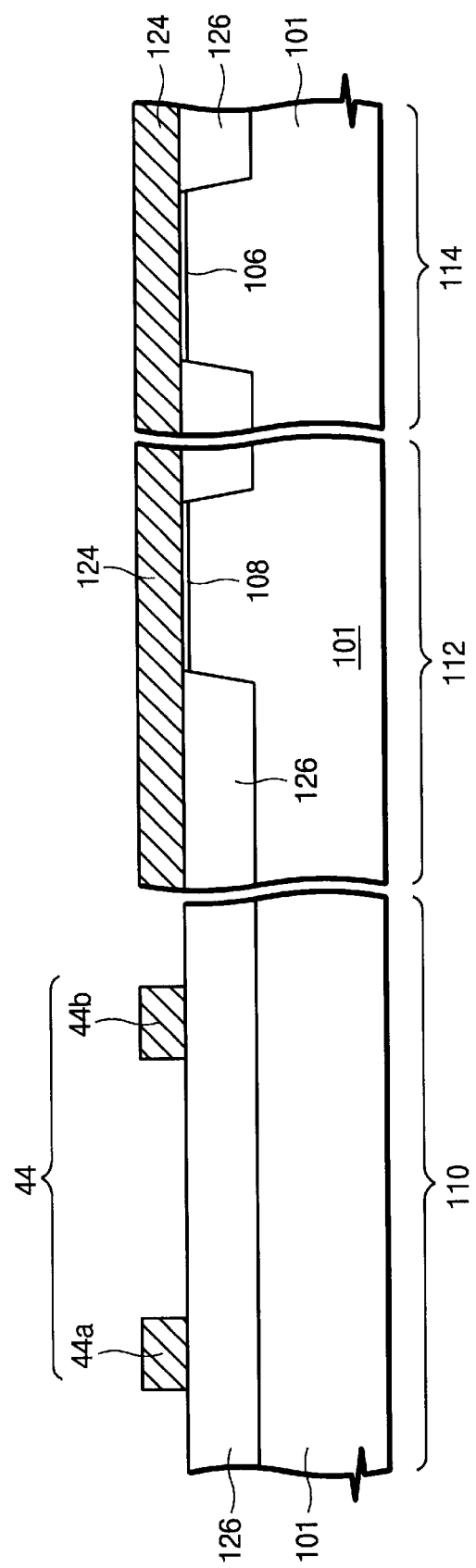
FIGS. 7–11 are cross-sectional views taken generally along the lines Y–Y' of FIG. 6, and illustrate sequential process steps of the device's manufacture in accordance with one embodiment of the invention.

Thus, in accordance with one embodiment of the invention, the related art problem of the surface of the fuse 111 not being fully exposed during formation of the contact holes 105a of the fuse 111 is avoided FIG. 7–FIG. 11 are cross-sectional views illustrating the manufacturing method for the nonvolatile memory device according to one embodiment of the present invention. FIG. 7 shows a process of forming the dummy patterns 44. The field oxide layer 126 defining the active region is formed on the semiconductor substrate 101. A tunnel oxide layer 106 is formed on the active region of the memory cell array region 114 and a gate oxide layer 108 is formed on the active region of the peripheral circuit region 112. A first polysilicon layer 124 is patterned, as shown in FIG. 7, to form the dummy patterns 44 in the passive device region 110.

Figure 8:
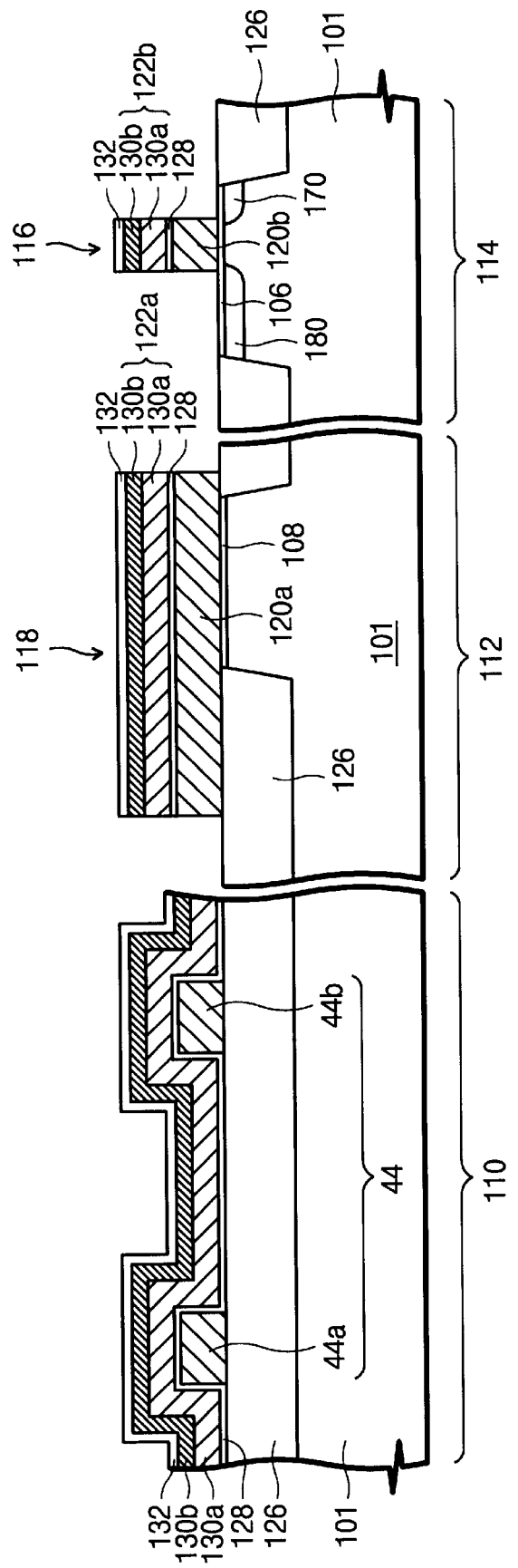

FIG. 8 shows a process of forming the stacked gate of the memory cell 116 and the stacked gate of the peripheral circuit transistor 118. An interlayer insulating layer 128, a second polysilicon layer 130a, a tungsten silicide layer 130b, and a mask oxide layer 132 used as a protecting layer are sequentially formed on the resultant structure of the substrate 101. The tungsten silicide layer 130b lowers the resistance of the second polysilicon layer 130a. The interlayer insulating layer 128 preferably is formed of a first oxide film/silicon nitride film/second oxide film (ONO).

The mask oxide layer 132, the tungsten silicide layer 130b, the second polysilicon layer 130a, the interlayer insulating layer 128 and the first polysilicon layer 124 are etched in the peri-transistor circuit region 112 to form the gate 120a, 122a of the peripheral circuit transistor 118. The gate 120a, 122a is patterned to extend over the field oxide layer 126. Impurities are introduced into the substrate 101 by a conventional ion implantation process to form source/drain regions 170, 180 of the memory cell 116 and source/drain regions (not shown) of the peripheral circuit transistor 118.

In accordance with a preferred embodiment of the invention, the thickness of the various layers of the patterned gate regions are as follows: the first polysilicon layer, approximately 2,000 Å; the ONO layer, approximately 155 Å; the second polysilicon layer, the tungsten silicide layer and the mask oxide layer, approximately 1000 Å each; the first and second stopper silicon nitride layers approximately 500 Å each; the first ILD layer approximately 8,000 Å; and the second ILD layer (ILD2) approximately 2,500 Å.

Those of skill in the art, of course, will appreciate that a particular layer thickness is not considered critical to the invention, and that alternative lay-ups are contemplated and are within the spirit and scope of the invention.

Figure 4:
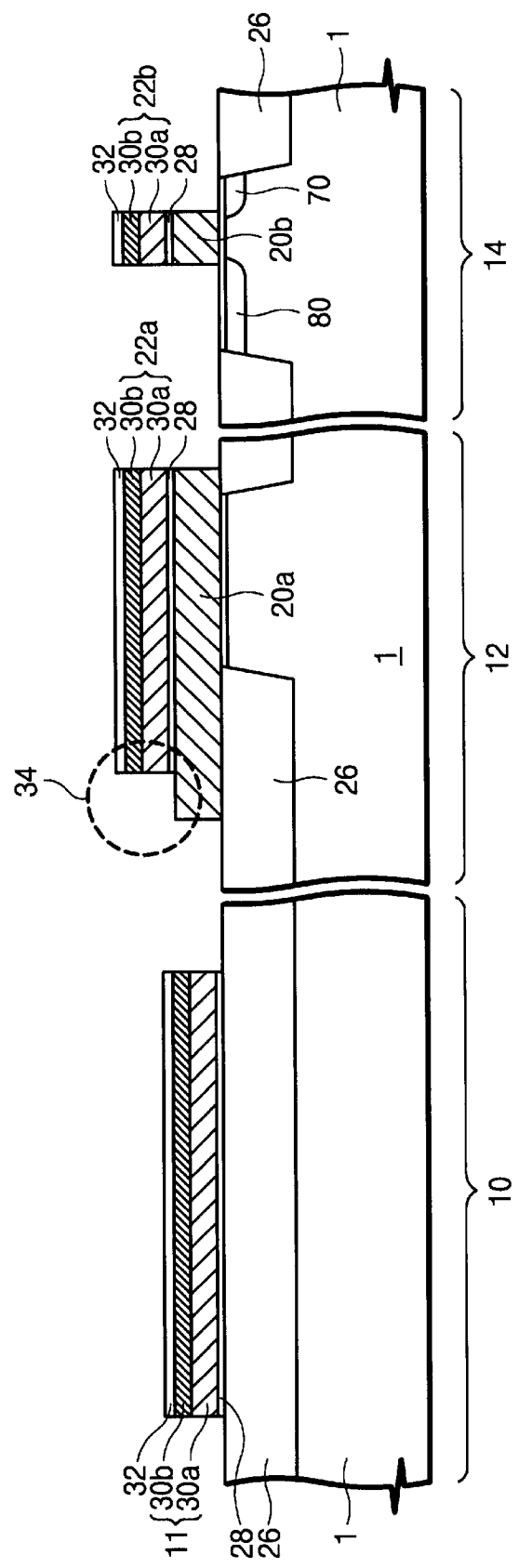
Figure 5:
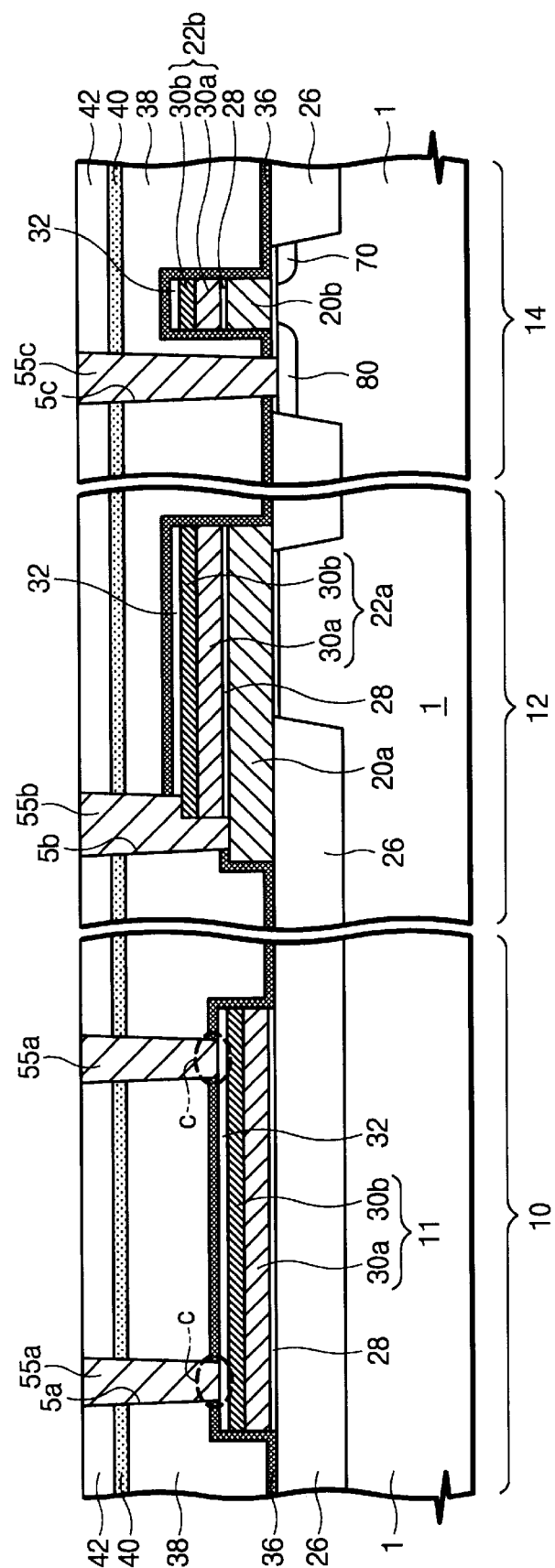
Figure 9:
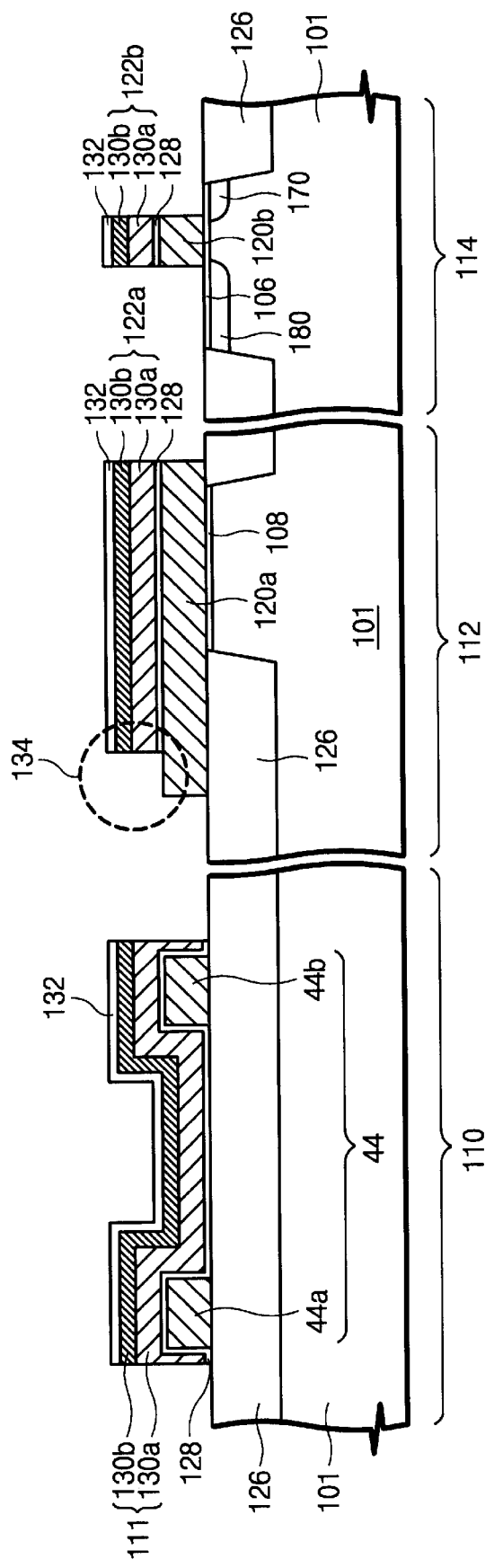

FIG. 9 illustrates the process of forming a butting contact area 134 and the fuse 111. A first portion 120a of the peri-transistor gate is exposed by patterning the mask oxide layer 132 and a second portion 122a of the gate using a butting contact mask, to enable the butting contact area 134 as shown and as described above by reference to FIG. 4. During the formation of the butting contact area 134, and the fuse 111 is formed by etching the mask oxide layer 132, the second polysilicon layer 130a, and the tungsten silicide layer 130b on the field oxide layer 126 of the passive device region 110. It is preferable that edge portions of the fuse 111 overlap, i.e. cover or surround, dummy patterns 44, as shown.

FIG. 10 illustrates the process of forming the contact holes 105a, 105b, and 105c. A first stopper silicon nitride layer 136 (hereinafter, an etch-stop or, simply, stopper layer) is deposited on the surface of the resultant structure of the substrate. A first ILD (ILD1) layer 138, a second stopper silicon nitride layer 140 and a second ILD layer (ILD2) 142 are formed, in that order, on the first stopper silicon nitride layer 136. Then the second ILD layer 142, the second stopper silicon nitride layer 140, the first ILD layer 138, a first stopper silicon nitride layer 136 and the mask oxide layer 132 are etched, in that order, using a metal contact mask pattern (not shown) formed on the second ILD layer 142 as an etching mask to form contact holes 105a, 105b, and 105c. The contact holes 105a, 105b, and 105c are filled with a conductive material to form the conductive paths 155a, 155b, and 155c.

Importantly, contact holes 105a, 105b in accordance with the invention extend all the way through the various layers to make full electrical contact with the tungsten silicide layer 130b—in the fuse area of passive device region 110, and the first conductive layer 120a in the butting contact area 134 of peri-transistor region 112. It is also noted that the contact hole 105c in the memory cell array region 114 extend all the way through the various layers to the substrate 101, without creating an undesirable recess in the active region.

The contact holes 105a, 105b, and 105c, expose the drain 180 of the memory cell transistor 116, the surfaces of the first conductive layer (a first portion) 120a and a second conductive layer (a second portion) 122a of the gate of the peripheral circuit transistor 118, and the surface of the fuse 111, respectively. It may be seen that the contact holes 105a of the fuse 111 are formed in an area where the dummy pattern 44 is formed. The surfaces of the fuse 111 and the gate of the peripheral circuit transistor preferably are substantially coplanar, as shown in FIG. 10. Therefore, the related art problem wherein the surface of the fuse 111 is not fully exposed during etching of the contact hole 105a is avoided. Electrodes, or conductive paths 155a, 155b, and 155c are formed by depositing a conductive film on the second ILD layer 142 and planarizing the resulting structure using conventional techniques. Thus, the bit line electrode 155c connected to the drain 180 of the memory cell transistor 116, the fuse electrode 155a connected to the fuse 111, and the electrode 155b connected to the first portion 120a and the second portion 122a of gate of the peripheral circuit transistor 118 are formed.

Figure 11:
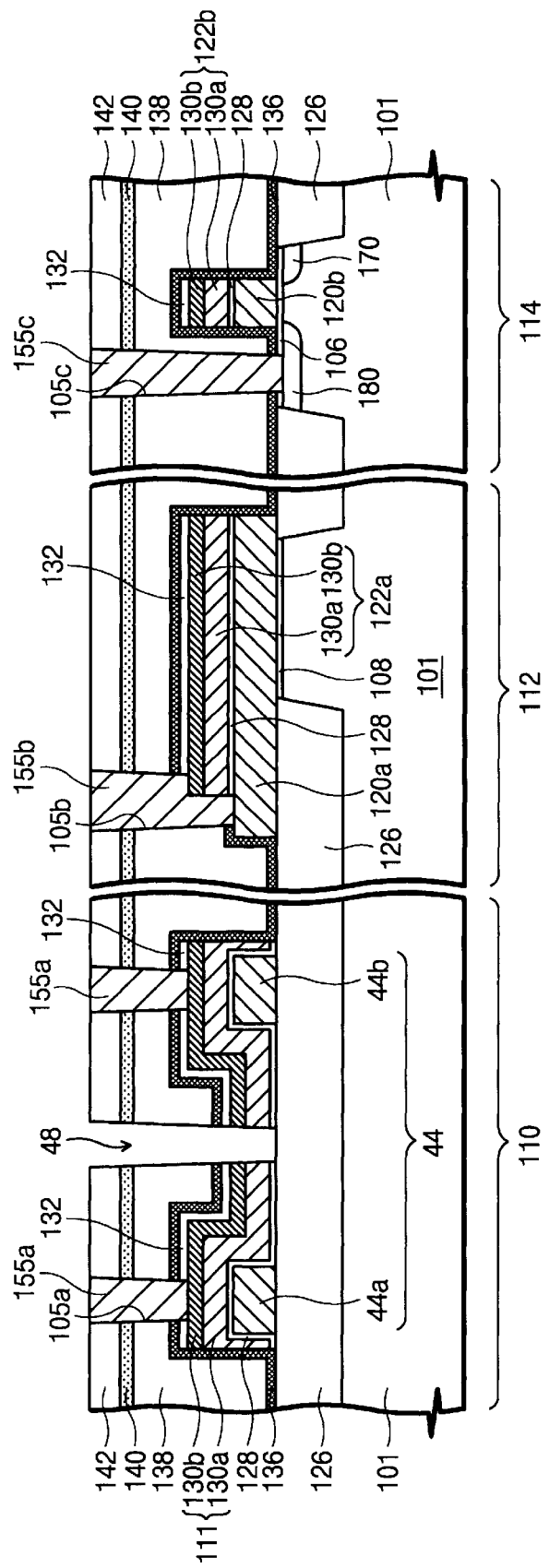

FIG. 11 is similar to FIG. 10, and shows a particularly useful embodiment of the invention in which the passive device is a fuse. It may be seen from FIG. 11 that controlled application of a laser cutting beam to the fuse 111 within the passive device region 110 of the semiconductor produces a laser-blown opening 48 of the relatively thin-film fuse 111 in a substantially medial region between dummy patterns 44. Those of skill in the art will appreciate this important structural advantage over conventional thick fuses that, after being laser-blown, can undesirably re-connect (typically by falling residual conductive or semi-conductive debris) to cause reliability problems.

In the preferred embodiments described above, some of the exemplary methods and structures in realizing the present invention are disclosed and presented herein. Those who are knowledgeable in the art should be able to easily derive other methods and structures within the spirit of the present invention. Therefore, the scope of the methods and structures in accordance with the present invention is not limited to the preferred embodiments presented and described here.

What is claimed is:

1. A passive device structure comprising:

an insulating layer formed on a semiconductor substrate;

adjacent laterally spaced dummy patterns of a first patterned conductive layer formed on the insulating layer, the dummy patterns having a thickness that defines a vertical extent of the dummy patterns on the insulating layer, the dummy patterns defining therebetween a lower-elevation lateral extent of an exposed region of the insulating layer;

a second patterned conductive layer overlying the dummy patterns and lateral extent of the exposed insulating layer, which forms a passive device; and adjacent electrodes substantially vertically aligned with the laterally spaced dummy patterns, connecting to the second patterned conductive layer, wherein the passive device is selected from the group consisting of a resistor, an inductor and a fuse.

2. The passive device structure of claim 1 which further comprises:

a first oxide film/silicon nitride film/second oxide film (ONO) layer overlying the spaced dummy patterns, the ONO layer intervening between each of the spaced dummy patterns and the second patterned conductive layer.

3. The passive device structure of claim 1 which further comprises:

one or more pairs of composite layers including an etch stopper layer overlying the second patterned conductive layer and an interlayer dielectric (ILD) layer overlying the etch stopper layer.

4. The passive device structure of claim 1, wherein first patterned conductive layer is a first polysilicon layer.

5. The passive device structure of claim 1, wherein a second patterned conductive layer is a composite layer including a second polysilicon layer and a silicide layer overlying the second polysilicon layer.

6. An integrated circuit device formed on a semiconductor substrate, comprising:

a transistor formed on the substrate, the transistor including a source region, a drain region, a first portion of a gate, a second portion of the gate, and a first insulator interposed between the first portion and the second portion;

first and second shoulders of a defined vertical extent formed over the substrate, laterally spaced apart from each other;

a first patterned conductive layer formed over the substrate, the first patterned conductive layer comprising a first portion overlying the substrate, a second portion overlying the first shoulder, and a third portion overlying the second shoulder, wherein the first patterned conductive layer is a passive device and wherein the passive device is selected from the group consisting of a resistor, an inductor and a fuse;

a second insulator interposed between the first and second shoulders, and the first patterned conductive layer;

a first conductive path connected to the second portion of the first patterned conductive layer formed over the substrate; and a second conductive path connected to the third portion of the first patterned conductive layer formed over the substrate.

7. The integrated circuit device of claim 6, wherein the shoulders is formed of a polysilicon film.

8. The integrated circuit device of claim 6, wherein the first patterned conductive layer is formed of a composite conductive film including a polysilicon film and a silicide film.

9. The integrated circuit device of claim 6, further comprising:

an insulating layer interposed between the shoulders and the first portion of the first patterned conductive layer, and the substrate.

10. The integrated circuit device of claim 6, wherein the first and second insulators are formed of a first oxide film/silicon nitride film/second oxide film (ONO).

11. An integrated circuit device formed on a semiconductor substrate, comprising:

a transistor formed on the substrate, the transistor including a source region, a drain region, a first portion of a gate, a second portion of the gate, and a first insulator interposed between the first portion and the second portion;

first and second shoulders of a defined vertical extent formed over the substrate, laterally spaced apart from each other;

a first patterned conductive layer formed over the substrate, comprising a first portion overlying the substrate, a second portion overlying the first shoulder, and a third portion overlying the second shoulder;

a second insulator interposed between the first and second shoulders, and the first patterned conductive layer;

a first conductive path connected to the second portion of the first patterned conductive layer; and a second conductive path connected to the third portion of the first patterned conductive layer;

wherein the first portion of the gate and the shoulders are formed of a first same material film, wherein the second portion of the gate and the first patterned conductive layer are formed of a second same material film, and wherein said conductive paths are substantially vertically aligned with said shoulders.

12. The integrated circuit device of claim 11, wherein the first patterned conductive layer is a passive device.

13. The integrated circuit device of claim 12, wherein the passive device is selected from the group consisting of a resistor, an inductor and a fuse.

14. The integrated circuit device of claim 11, wherein the first same material film is a polysilicon film.

15. The integrated circuit device of claim 11, wherein the second same material is a composite conductive film including a polysilicon film and a silicide film.

16. The integrated circuit device of claim 11, further comprising:

an insulating layer interposed between the shoulders and the first portion of the first patterned conductive layer, and the substrate.

17. The integrated circuit device of claim 11, wherein the first and second insulators are formed of a first oxide film/silicon nitride film/second oxide film (ONO).

18. A semiconductor device having a memory cell array region and a peripheral circuit region formed on a semiconductor substrate, comprising:

a memory cell transistor comprising source/drain regions, a floating gate, and a control gate, and a first insulator intervening between the control gate and the floating gate, formed on the semiconductor substrate in the memory cell array region thereof;

a peripheral circuit transistor comprising source/drain regions, a first portion of a gate, a second portion of the gate, and a second insulator formed on the fist portion, and the second portion formed on the second insulator, formed on the substrate in the peripheral circuit region;

first and second shoulders formed of a first patterned conductive layer of a defined vertical extent over the substrate in the peripheral circuit region, laterally spaced apart from each other;

a passive device formed of a second patterned conductive layer over the substrate in the peripheral circuit region, comprising a first portion overlying the substrate, a second portion overlying the first shoulder, and a third portion overlying the second shoulder, wherein the passive device is selected from the group consisting of a resistor, an inductor and a fuse;

a third insulator interposed between the shoulders and the passive device;

a first conductive path connected to the second portion of the second patterned conductive layer in the peripheral circuit region; and a second conductive path connected to the third portion of the second patterned conductive layer in the peripheral circuit region, wherein said conductive paths are substantially vertically aligned with said shoulders.

19. The device of claim 18, wherein the first portion of the gate and the shoulders is formed of a first same material film.

20. The device of claim 18, wherein the first same material film is a polysilicon film.

21. The device of claim 18, wherein the second portion of the gate and the second patterned conductive layer is formed of a second same material film.

22. The device of claim 18, wherein the second same material film is a composite conductive film including a polysilicon film and a silicide film.

23. The device of claim 18, further comprising:
an insulating layer interposed between the shoulders and the first portion of the passive device, and the substrate.

24. The device of claim 23, wherein the insulating layer is a field oxide layer.

25. The device of claim 18, wherein the first insulator, second insulator and third insulator are formed of an oxide film/silicon nitride film/oxide film (ONO).

26. The device of claim 18, wherein the passive device is a fuse.

27. A semiconductor device having a memory cell array region and a peripheral circuit region formed on a semiconductor substrate, comprising:

a memory cell transistor comprising source/drain regions, a floating gate, and a control gate, and an first insulator intervening between the control gate and the floating gate, formed on the semiconductor substrate in the memory cell array region;

a peripheral circuit transistor comprising source/drain regions, a first portion of a gate, a second portion of the gate, and a second insulator formed on the first portion, and the second portion formed on the second insulator, the peripheral circuit transistor being formed on the substrate in the peripheral circuit region;

first and second shoulders formed of a first patterned conductive layer of a defined vertical extent over the substrate in the peripheral circuit region, laterally spaced apart from each other;

a fuse formed of a second patterned conductive layer over the substrate in the peripheral circuit region, comprising a first portion overlying the substrate, a second portion overlying the first shoulder, and a third portion overlying the second shoulder, a third insulator interposed between the shoulders and the fuse;

a first conductive path connected to the second portion of the fuse in the peripheral circuit region; and a second conductive path connected to the third portion of the fuse in the peripheral circuit region, wherein the first portion of the gate, the floating gate and the first patterned conductive layer are formed of a first same material, and wherein the second portion of the gate, the control gate and the second patterned conductive layer are formed of a second same material, and wherein said conductive paths are substantially vertically aligned with said shoulders.

28. The integrated circuit device of claim 27, wherein the first same material film is a polysilicon film.

29. The integrated circuit device of claim 27, wherein the second same material is a composite conductive film including a polysilicon film and a silicide film.

30. The integrated circuit device of claim 27, further comprising:
an insulating layer interposed between the shoulders and the first portion of the fuse, and the substrate.

31. The integrated circuit device of claim 27, wherein the first, second and third insulators are formed of a first oxide film/silicon nitride film/second oxide film (ONO).

32. A fuse structure comprising:

an insulating layer formed on a semiconductor substrate;

adjacent laterally spaced dummy patterns of a first patterned conductive layer formed on the insulating layer, the dummy patterns having a thickness that defines a vertical extent of the dummy patterns on the insulating layer, the dummy patterns defining therebetween a lower-elevation lateral extent of an exposed region of the insulating layer;

a fuse overlying the dummy patterns and the lateral extent of the exposed insulating layer, the fuse having a laser-blown opening in a substantially medial region between the dummy patterns; and adjacent electrodes substantially vertically aligned with the laterally spaced dummy patterns, connecting to the fuse.

33. The fuse structure of claim 32, further comprising:
one or more pairs of composite layers including an etch stopper layer overlying a second patterned conductive layer and an interlayer dielectric layer (ILD) overlying the etch stopper.

34. The fuse structure of claim 32, wherein the first patterned conductive layer is a polysilicon layer.

35. The fuse structure of claim 32, wherein the fuse is formed of a composite layer including a polysilicon layer and a silicide layer.

36. The fuse structure of claim 32, further comprising:
a first oxide film/silicon nitride film/second oxide film (ONO) layer overlying the dummy patterns, the ONO layer disposed between the dummy patterns and the fuse.

* * * * *